US006889038B2

(12) United States Patent
Khosrowbeygi

(10) Patent No.: US 6,889,038 B2
(45) Date of Patent: May 3, 2005

(54) DYNAMIC BIASING OF A TRANSMITTER

(75) Inventor: Abolfazl Khosrowbeygi, Sunnyvale, CA (US)

(73) Assignee: Koninklijke Philips Electronics N.V., Eindhoven (NL)

( * ) Notice: Subject to any disclaimer, the term of this patent is extended or adjusted under 35 U.S.C. 154(b) by 753 days.

(21) Appl. No.: 09/827,625

(22) Filed: Apr. 6, 2001

(65) Prior Publication Data

US 2002/0146992 A1 Oct. 10, 2002

(51) Int. Cl.⁷ .................................................. H04B 1/28
(52) U.S. Cl. .................. 455/333; 455/127.2; 455/114.2
(58) Field of Search ............................. 455/125, 127.2, 455/115.1, 91, 129, 127.1, 333, 326, 296, 114.2, 420; 327/105, 359, 233

(56) References Cited

U.S. PATENT DOCUMENTS

| | | | | |
|---|---|---|---|---|
| 4,479,259 A | * | 10/1984 | Fenk ........................... | 455/318 |
| 4,480,337 A | * | 10/1984 | Graziadei et al. ........... | 455/333 |
| 5,193,223 A | | 3/1993 | Walczak et al. | |
| 5,287,555 A | | 2/1994 | Wilson et al. | |
| 5,548,616 A | | 8/1996 | Mucke et al. | |
| 5,642,378 A | | 6/1997 | Denheyer et al. | |
| 5,884,154 A | * | 3/1999 | Sano et al. .................. | 455/321 |
| 6,037,825 A | * | 3/2000 | Kung .......................... | 327/359 |
| 6,057,714 A | * | 5/2000 | Andrys et al. ............... | 327/105 |
| 6,175,274 B1 | * | 1/2001 | Groe ........................... | 330/51 |
| 6,429,721 B1 | * | 8/2002 | Armitage et al. ........... | 327/359 |
| 6,639,447 B1 | * | 10/2003 | Manku et al. ............... | 327/359 |
| 6,748,204 B1 | * | 6/2004 | Razavi et al. ............... | 455/296 |

* cited by examiner

*Primary Examiner*—Sonny Trinh
(74) *Attorney, Agent, or Firm*—Aaron Waxler

(57) ABSTRACT

A dynamic biasing of a transmitter chip is disclosed. The transmitter chip comprises a variable gain amplifying stage, a biasing stage, a phase shifting stage, and a mixing stage. In response to a voltage control signal and a voltage intermediate frequency signal, the variable gain amplifying stage provides a current drive signal and a DC current control signal. While an ampere level of the DC component of the current drive signal and an ampere level of the DC current control signal vary as a function of any variations in the voltage control signal as well as any variation in the temperature, process performance, and supply power of the transmitter chip, a ratio of the ampere level of a DC component of the current drive signal to the ampere level of the DC current control signal is constant. The current drive signal and the DC current control signal establish the dynamic biasing block in a current mode of operation that maintains a constant gain of the mixing stage.

19 Claims, 9 Drawing Sheets

DYNAMIC BIASING OF A TRANSMITTER

BACKGROUND OF THE INVENTION

1. Field of the Invention

The present invention generally relates to transmitters. The present invention specifically relates to dynamic biasing of currents within a transmitter chip.

2. Description of the Related Art

In a transmitter chip, a current for biasing each block of the transmitter chip is a function of the required linearity and the output power. Some transmitter chips have the ability to dynamically adjust the output power. Consequently, the biasing current can be dynamically adjusted to reduce the total current consumption of the transmitter.

There are currently two techniques for dynamically adjusting a biasing current. The first technique involves a reading of a lookup table of biasing current settings whenever the output power is altered, and changing the biasing current accordingly. The second technique involves measuring the output power and dynamically generating appropriate biasing voltage and biasing currents as a function of the measured output power. Neither of these techniques is immune to any variations in a temperature, a supply power, and a processing performance of the transmitter chip. Additionally, neither of these techniques can continually keep the overall gain of the transmitter chip constant as the bias currents are dynamically adjusted. Thus, prior to the present, an efficient and effective technique for dynamically adjusting a biasing current while maintaining a constant overall gain was not achieved.

SUMMARY OF THE INVENTION

The present invention relates to a dynamic biasing of currents within a transmitter chip that overcomes the disadvantages of the prior art. Various aspects of the invention are novel, non-obvious, and provide various advantages. While the actual nature of the present invention covered herein can only be determined with reference to the claims appended hereto, certain features, which are characteristic of the embodiments disclosed herein, are described briefly as follows.

One form of the present invention is variable gain amplifying stage for a transmitter chip comprising a first circuit and a second circuit. The first circuit is operable to provide a current drive signal in response to a reception of a voltage control signal and a voltage intermediate frequency signal by the variable gain amplifying stage. The current drive signal has an AC current component and a DC current component. The second circuit is operable to provide a DC current control signal in response to a reception of the voltage control signal by the variable gain amplifying stage. The ratio of an ampere level of the DC current component of the current drive signal to an ampere level of the DC current control signal is constant.

A second form of the present invention is a transmitter chip comprising a variable gain amplifying stage, and a biasing stage. The variable gain amplifying stage is operable to provide a current drive signal and a DC current control signal. The current drive signal has an AC component and a DC component. The biasing stage is operable to provide a DC current biasing signal in response to a reception of the DC current control signal. The ratio of an ampere level of the DC component of the current drive signal to an ampere level of the DC current control signal is constant.

A third form of the present invention is a transmitter chip comprising a variable gain amplifying stage, and a phase shifting stage. The variable gain amplifying stage is operable to provide a current drive signal and a DC current control signal. The current drive signal has an AC component and a DC component. The phase shifting stage is operable to provide a current intermediate frequency signal in response to a reception of the current drive signal. The ratio of an ampere level of the DC component of the current drive signal to an ampere level of the DC current control signal is constant.

The foregoing forms and other forms, features and advantages of the present invention will become further apparent from the following detailed description of the presently preferred embodiments, read in conjunction with the accompanying drawings. The detailed description and drawings are merely illustrative of the present invention rather than limiting, the scope of the present invention being defined by the appended claims and equivalents thereof.

DETAILED DESCRIPTION OF THE PRESENTLY PREFERRED EMBODIMENTS

Figure 1:
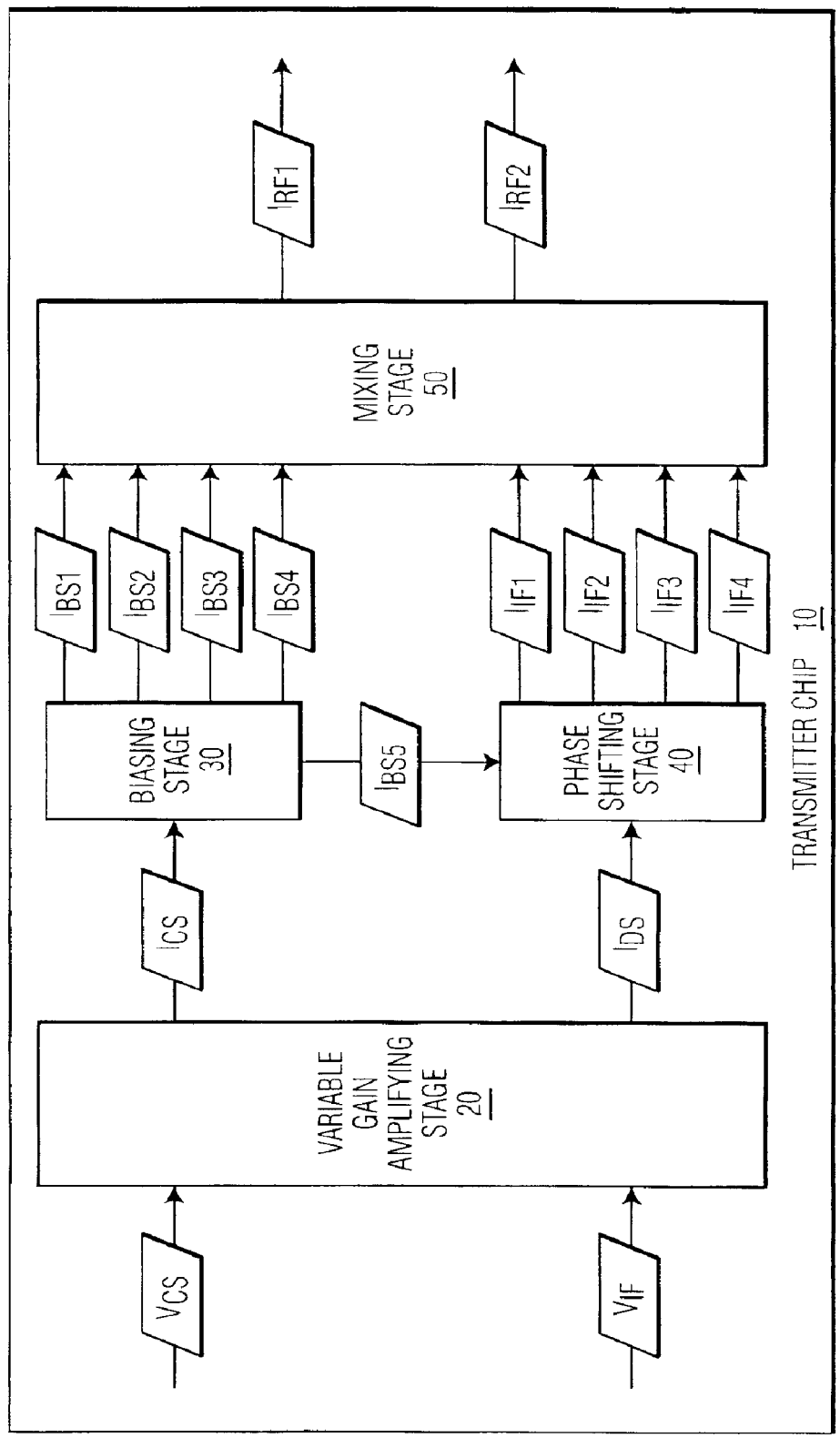
FIG. 1 is a block diagram of one embodiment of a transmitter chip in accordance with the present invention.

A block diagram of a transmitter chip 10 of the present invention is shown in FIG. 1. Referring to FIG. 1, transmitter chip 10 comprises a variable gain amplifying stage 20, a biasing stage 30, a phase shifting stage 40, and a mixing stage 50 for implementing the principles of the present invention. Other stages and components of transmitter chip 10 are not shown for the clarity of describing the present invention. However, from the subsequent description herein of stage 20, stage 30, stage 40 and stage 50 of transmitter chip 10, those having ordinary skill in the art will appreciate such additional stages and components of transmitter chip 10. Also, those having ordinary skill in the art will appreciate that transmitter chip 10 operates in a current mode of operation as opposed to the prior art manner of operating transmitter chips in a voltage mode of operation.

Figure 2A:
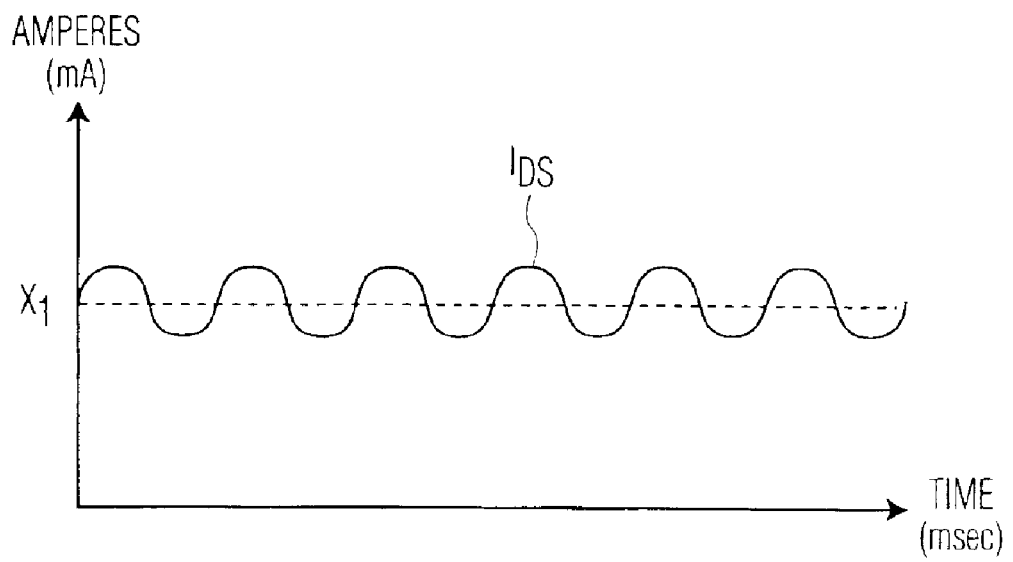
FIG. 2 illustrates a current drive signal and a DC current control signal provided by a variable gain amplifying stage of the FIG. 1 system.
Figure 2B:
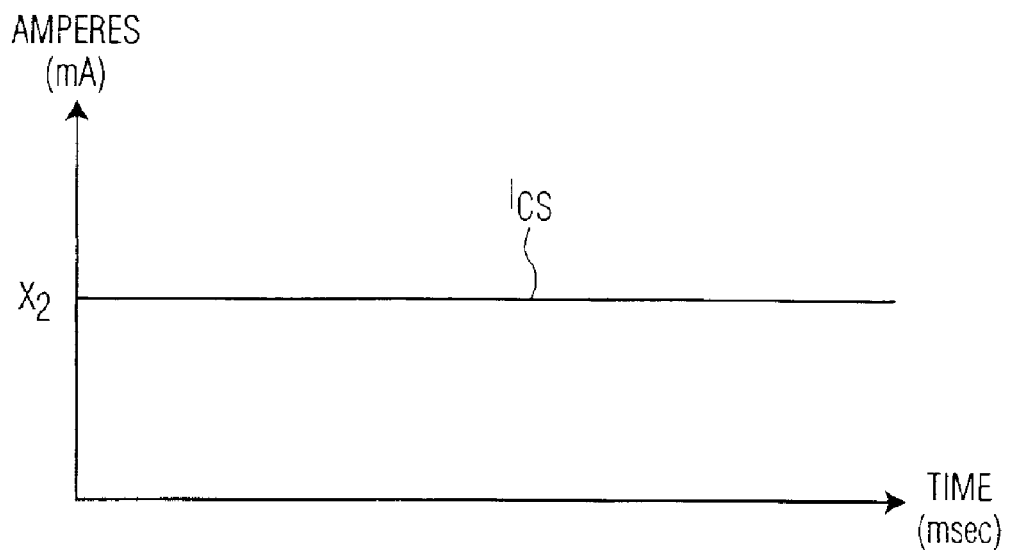
Figure 3A:
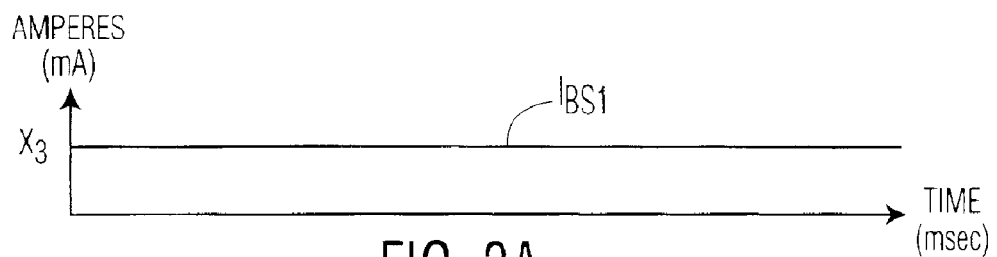
FIG. 3 illustrates five (5) DC current biasing signals provided by a biasing stage of the FIG. 1 system.
Figure 3B:
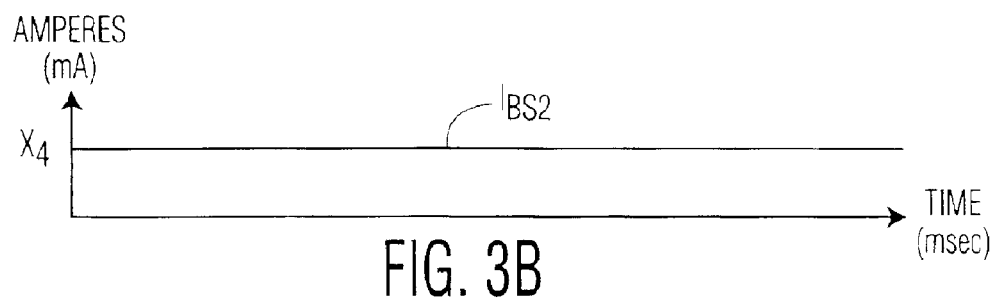
Figure 3C:
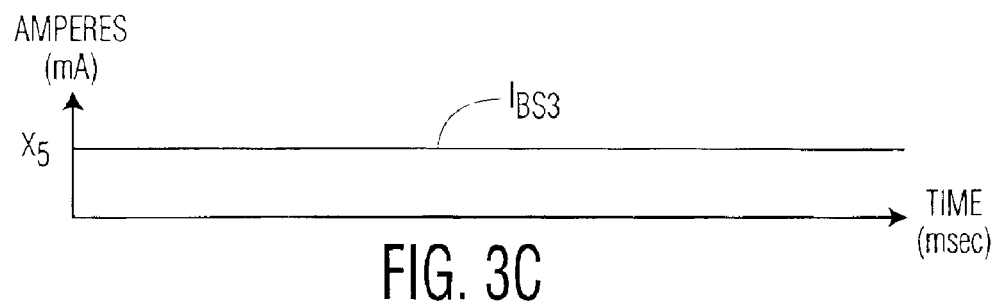
Figure 3D:
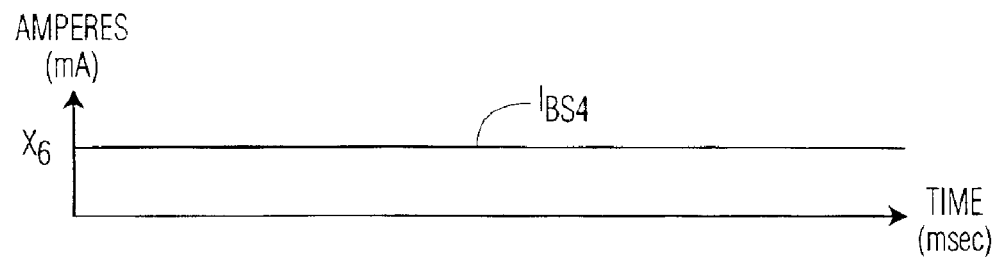
Figure 3E:
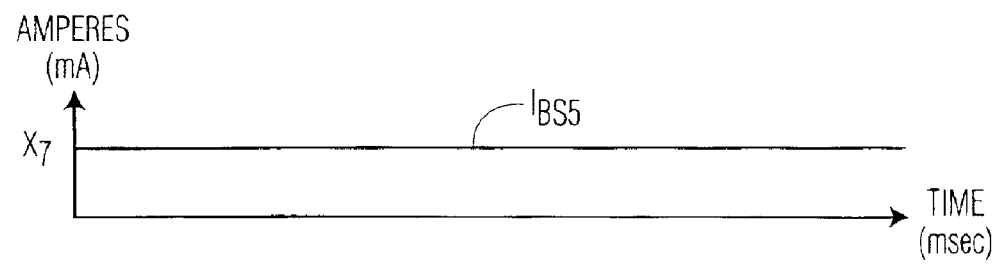
Figure 4A:
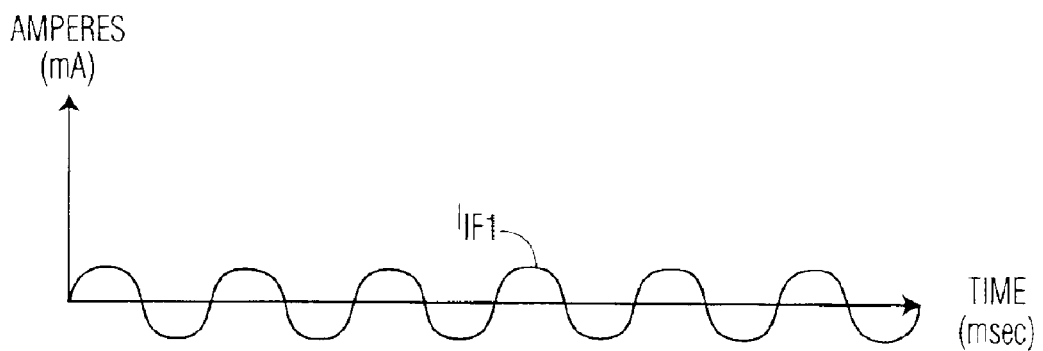
FIG. 4 illustrates four (4) current intermediate frequency signals as provided by a phase shifting stage of the FIG. 1 system.
Figure 4B:
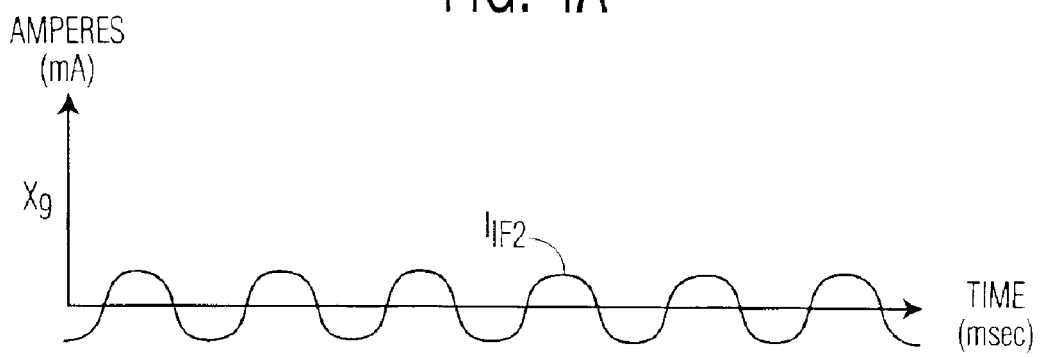
Figure 4C:
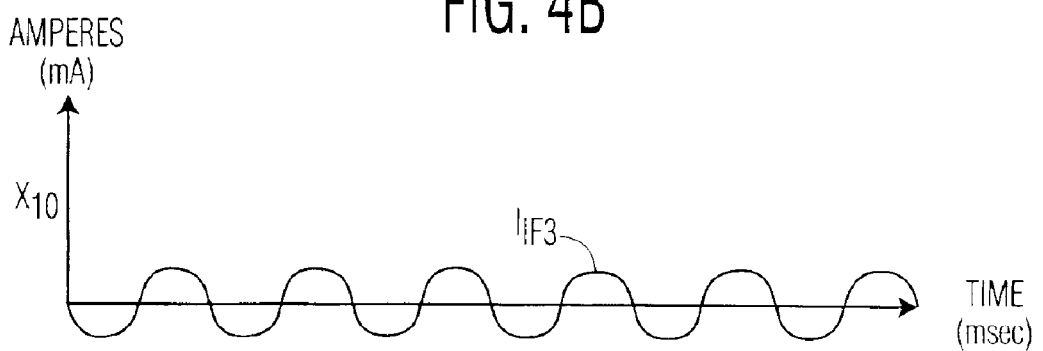
Figure 4D:
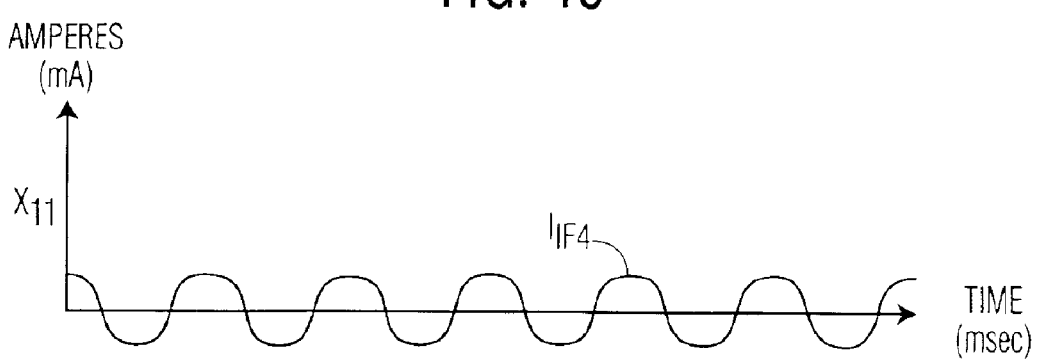

Referring to FIGS. 1 and 2, variable gain amplifying stage 20 receives a voltage control signal $V_{CS}$ from an allocated pin for gain control (not shown) of transmitter chip 10 and a voltage signal $V_{IF}$ at intermediate frequency (e.g., 150 MHz to 250 MHz) from an I/Q modulator block (not shown) of transmitter chip 10. In response thereto, variable gain amplifying stage 20 provides an current drive signal $I_{DS}$ to phase shifting stage 40 and a DC current control signal $I_{CS}$ to biasing stage 30. Current drive signal $I_{DS}$ has an AC current component and a DC current component. As will be described in more detail herein in connection with FIGS. 6–9, an ampere level $X_1$ of the DC component of current drive signal IDS and an ampere level $X_2$ of DC current control signal $I_{CS}$ are immune to any variances in an operating temperature, a processing performance, and a supply power of transmitter chip 10. Ampere level $X_1$ of the DC component of current drive signal $I_{DS}$ and ampere level $X_2$ of DC current control signal $I_{CS}$ change in response to any change in the voltage level of voltage control signal $V_{CS}$. However, to establish a high degree of insensitivity to any change in the voltage level of voltage control signal $V_{CS}$, a ratio $Y_1$ of ampere level $X_1$ to ampere level $X_2$ (i.e., $Y_1=X_1/X_2$) remains constant as will be described in more detail herein in connection with FIGS. 6–9.

Referring to FIGS. 1–3, in response to current control signal $I_{CS}$, biasing stage 30 outputs four (4) DC current biasing signals $I_{BS1\text{-}BS4}$ to mixing stage 50, and a DC current biasing signal $I_{BS5}$ to phase shifting stage 40. As shown in FIG. 3, ampere levels $X_{3\text{-}7}$ of DC current biasing signals $I_{BS1\text{-}SS5}$, respectively, are designed to be identical. Ampere levels $X_{3\text{-}7}$ are also dynamically varied in response to any change in ampere level $X_2$ of DC current control signal $I_{CS}$ with ratios $Y_{2\text{-}6}$ of ampere levels $X_{3\text{-}7}$ to ampere level $X_2$ (i.e., $Y_2=X_3/X_2$; $Y_3=X_4/X_2$; $Y_4=X_5/X_2$; $Y_5=X_6/X_2$; and $Y_6=X_7/X_2$), respectively remaining constant. Those having ordinary skill in the art will appreciate various conventional embodiments of biasing stage 30, such as, for example, current mirrors.

Referring to FIGS. 1, 2 and 4, in response to current drive signal IDS and DC current biasing signal $I_{BS5}$, phase shifting stage 40 provides four (4) current signals $I_{IF1\text{-}IF4}$ at an intermediate frequency (e.g., 150 MHz to 250 MHz) and phase shifted by 90 degrees to mixing stage 50. Those having ordinary skill in the art will appreciate various conventional embodiments of phase shifting stage 40, such as, for example, poly-phase phase shifter stages, buffer amplifiers and the like.

Figure 5A:
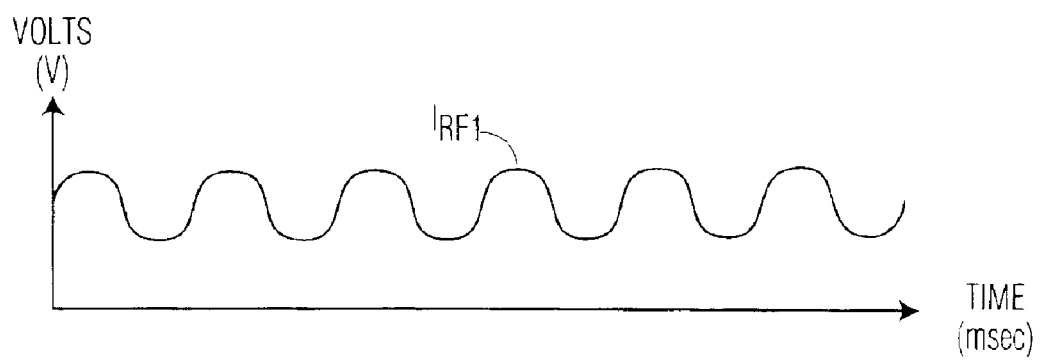
FIG. 5 illustrates two (2) current radio frequency signals as provided by a mixing stage of the FIG. 1 system.
Figure 5B:
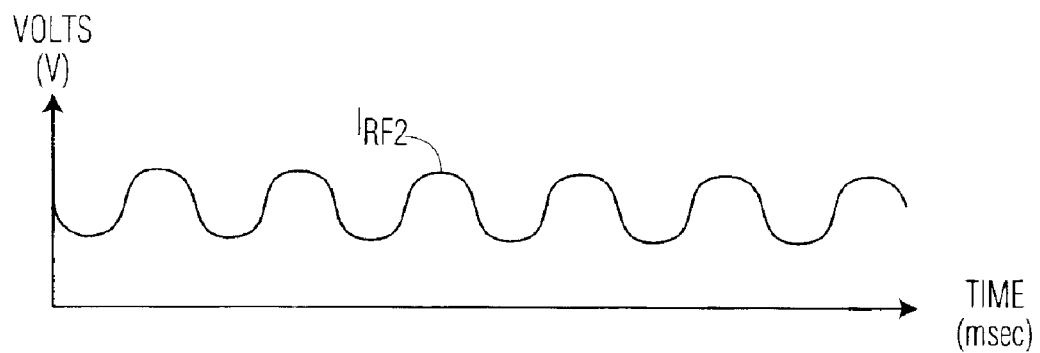

Referring to FIGS. 1 and 5, in response to DC current biasing signals $I_{BS1\text{-}BS4}$ and current intermediate frequency signals $I_{IF1\text{-}F4}$, mixing stage 50 provides a pair of differential current signals $I_{RF1}$ and $I_{RF2}$ at a radio frequency (e.g., 900 MHz to 1900 MHz) to an external balun (not shown) of transmitter chip 10. The current radio frequency signal $I_{RF1}$ and $I_{RF2}$ each have an AC current component and a DC current component. As shown in FIG. 5, current radio frequency signal $I_{RF2}$ is 180 degrees out of phase from current radio frequency signal $I_{RF1}$ with the peak-to-peak amplitudes of the signals being identical. Those having ordinary skill in the art will appreciate various conventional embodiments of mixing stage 50, such as, for example, in-phase and out of phase mixers, image rejecter mixers, and the like. Those having ordinary skill in the art will appreciate that, while a total current consumption by transmitter chip 10 changes as a function of any variations in voltage control signal $V_{CS}$, the operating temperature of transmitter chip 10, a processing performance of transmitter chip 10, or supply power of transmitter chip 10, the overall gain of the mixing stage 50 is constant.

Figure 6:
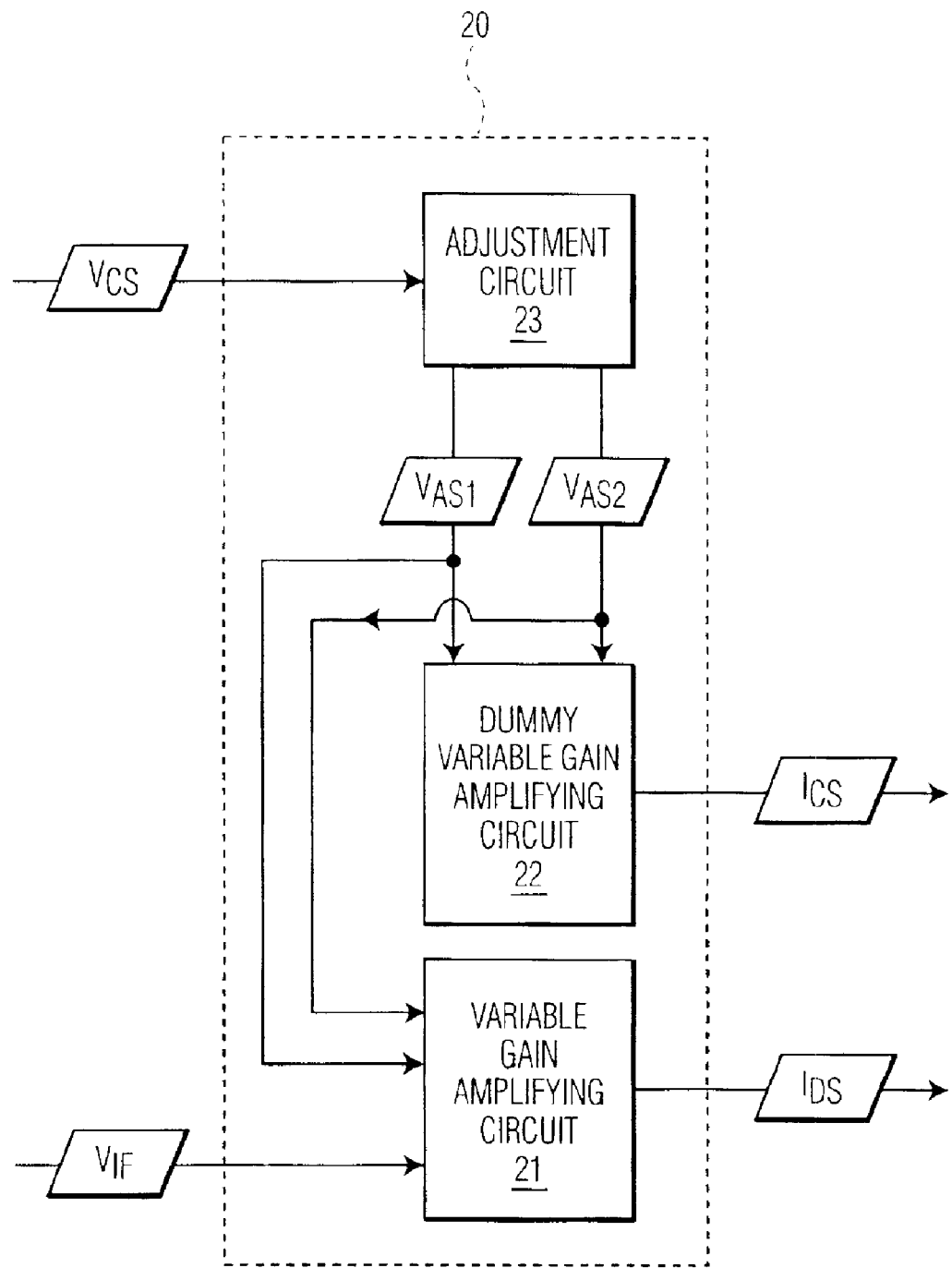
FIG. 6 is a block diagram of one embodiment in accordance with the present invention of the variable gain amplifying stage of the FIG. 1 biasing block.

Referring to FIGS. 1 and 6, one embodiment of amplifying stage 20 comprising a variable gain amplifying circuit 21 (hereinafter "VGA 21"), a dummy variable gain amplifying circuit (hereinafter "dummy VGA 22"), and an adjustment circuit 23 is shown. Adjustment circuit 23 receives voltage control signal $V_{CS}$, and in response thereto, provides a voltage adjustment signal $V_{AS1}$ and a voltage adjustment signal $V_{AS2}$ to VGA 21 and dummy VGA 22. VGA 22 also receives voltage intermediate frequency signal $V_{IF}$, and in response thereto provides current drive signal $I_{DS}$ to phase shifting stage 40. In response to voltage adjustment signal $V_{AS1}$ and a voltage adjustment signal $V_{AS2}$, dummy VGA 22 provides DC current control signal $I_{CS}$ to biasing stage 30. In one embodiment, dummy VGA 22 is a replica of VGA 21 that facilitates a separation of a DC current path for currents $I_{CS}$ and $I_{BS1\text{-}BS4}$ from variable gain amplifying stage 20 through biasing stage 30 to mixing stage 50, and a second current path for a AC current path for currents $I_{DS}$ and $I_{IF1\text{-}IF4}$ from variable gain amplifying stage 20 through phase shifting stage 40 to mixing stage 50. As a result, filtering with transmitter chip 10 is not required and a high degree of linearity of current radio frequency signal $I_{RF1}$ and current radio frequency signal $I_{RF2}$ is attained.

Figure 7A:
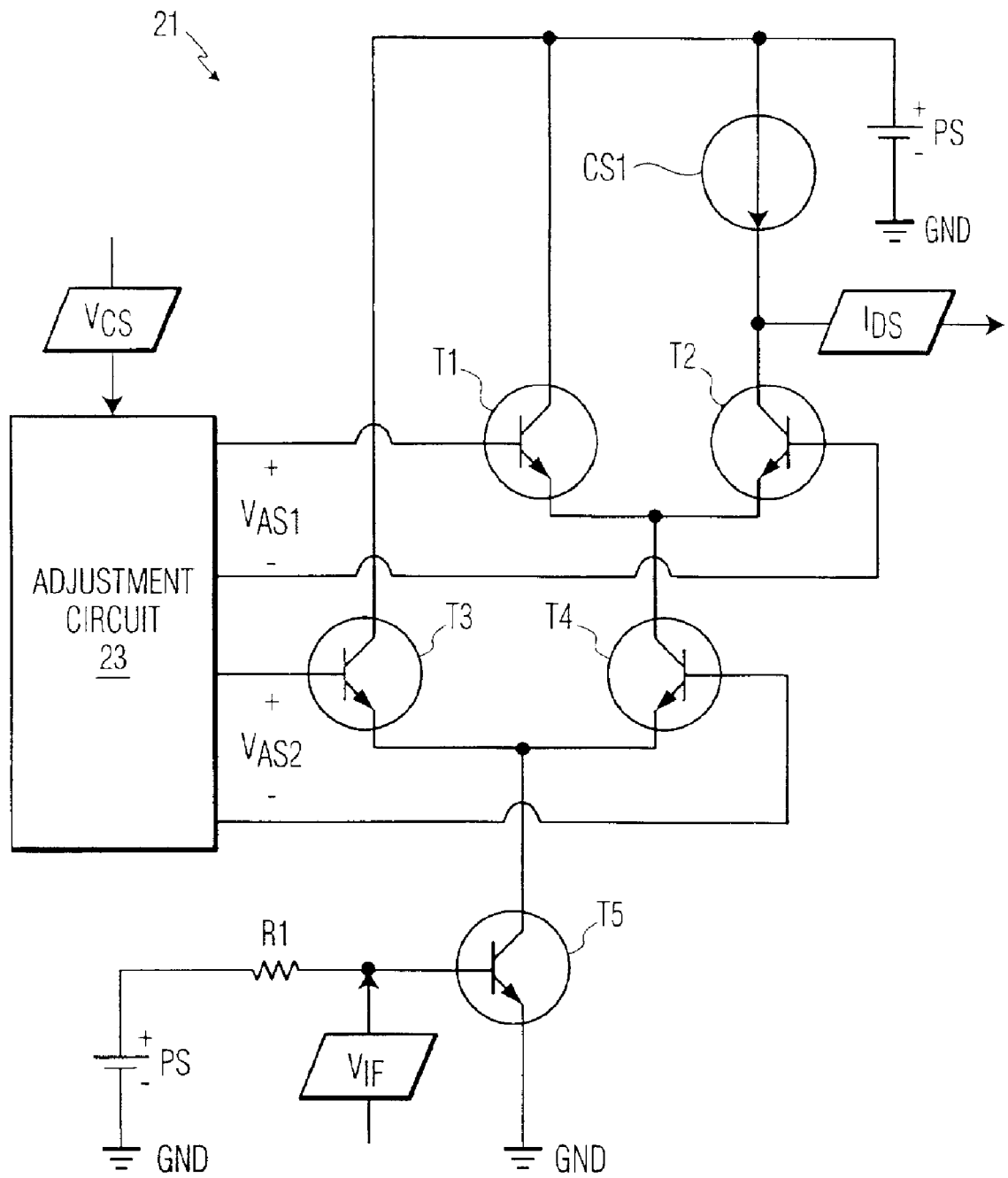
FIG. 7A is a schematic diagram of one embodiment in accordance with the present invention of a variable gain amplifying circuit of the FIG. 6 variable gain amplifying stage.

Referring to FIGS. 6 and 7A, one embodiment of VGA 21 is shown. VGA 21 includes a current source $CS_1$, an NPN transistor T1, an NPN transistor T2, an NPN transistor T3, an NPN transistor T4, an NPN transistor T5, and a resistor R1. Current source $CS_1$, a collector terminal of transistor T1 and a collector terminal of transistor T3 are electrically coupled to a power supply PS. A base terminal of transistor T1 and a base terminal of transistor T2 are electrically coupled to circuit 23 whereby voltage adjustment signal $V_{AS1}$ is applied between the base terminals of transistor T1 and transistor T2. An emitter terminal of transistor T1 and an emitter terminal of transistor T2 are electrically coupled to a collector terminal of transistor T4.

A base terminal of transistor T3 and a base terminal of transistor T4 are electrically coupled to circuit 23 whereby voltage adjustment signal $V_{AS2}$ is applied between the base terminals of transistor T3 and transistor T4. A base terminal of transistor T5 is electrically coupled with resistor R1, and resistor R1 is electrically coupled to power supply PS whereby a biasing voltage (not shown) is applied to the base terminal of transistor T5. Voltage intermediate frequency $V_{IF}$ is also applied to the base terminal of transistor T5. An emitter terminal of transistor T3 and an emitter terminal of transistor T4 are electrically coupled to a collector terminal of transistor T5. An emitter terminal of transistor T5 is electrically coupled to ground GND.

In response to voltage intermediate frequency $V_{IF}$, voltage adjustment signal $V_{AS1}$ and voltage adjustment signal $V_{AS2}$, current drive signal $I_{DS}$ is drawn by phase shifting stage 40 from current source CS1 with ampere level $X_1$ (FIG. 2) of current drive signal $I_{DS}$ being adjusted for any variations in the voltage level of voltage control signal $V_{CS}$, and any temperature, processing performance supply power variations of transmitter chip 10. The peak-to-peak amplitude of current drive signal $I_{DS}$ as shown in FIG. 2 is well controlled by voltage control signal $V_{CS}$. Particularly, circuit 23 provides an adjusted voltage $V_{AS1}$ and an voltage adjustment signal $V_{AS2}$ as a result of any pre-distortion and temperature compensation of voltage control signal $V_{CS}$.

Figure 7B:
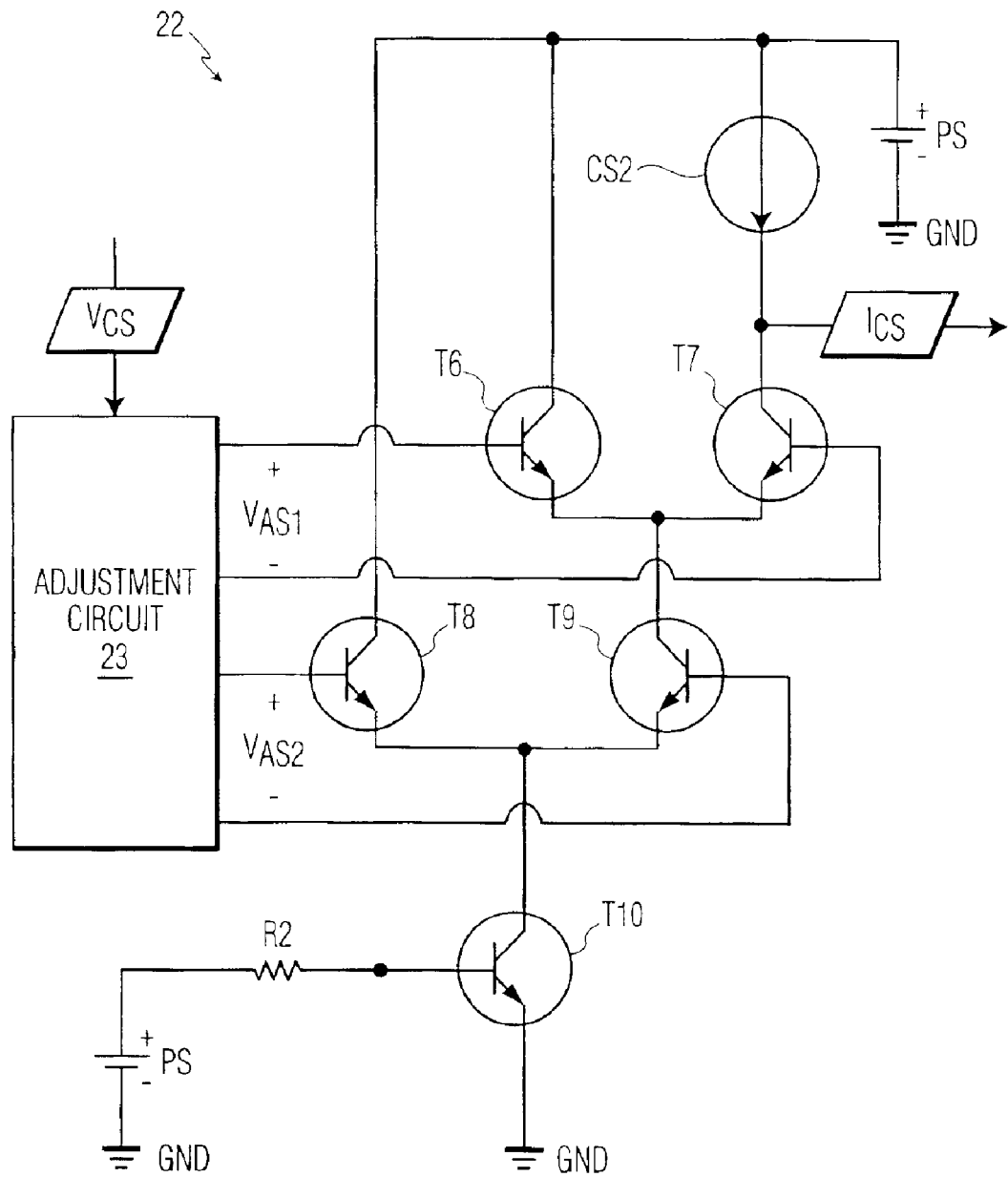
FIG. 7B is a schematic diagram of one embodiment in accordance with the present invention of a dummy variable gain amplifying circuit of the FIG. 6 variable gain amplifying stage.

Referring to FIGS. 6 and 7B, one embodiment of dummy VGA 22 is shown. Dummy VGA 22 includes a current source $CS_2$, an NPN transistor T6, an NPN transistor T7, an NPN transistor T8, an NPN transistor T9, an NPN transistor T10, and a resistor R2. Current source $CS_2$, a collector terminal of transistor T6 and a collector terminal of transistor T8 are electrically coupled to a power supply PS. A base terminal of transistor T6 and a base terminal of transistor T7 are electrically coupled to circuit 23 whereby voltage adjustment signal $V_{AS1}$ is applied between the base terminals of transistor T6 and transistor T7. An emitter terminal of transistor T6 and an emitter terminal of transistor T7 are electrically coupled to a collector terminal of transistor T9.

A base terminal of transistor T8 and a base terminal of transistor T9 are electrically coupled to circuit 23 whereby voltage adjustment signal $V_{AS2}$ is applied between the base terminals of transistor T8 and transistor T9. A base terminal of transistor T10 is electrically coupled with resistor R2, and resistor R2 is electrically coupled to power supply PS whereby a biasing (not shown) is applied to the base terminal of transistor T10. An emitter terminal of transistor T8 and an emitter terminal of transistor T9 are electrically coupled to a collector terminal of transistor T10. An emitter terminal of transistor T10 is electrically coupled to ground GND.

In response to voltage adjustment signal $V_{AS1}$ and voltage adjustment signal $V_{AS2}$, DC current control signal $I_{CS}$ is drawn from current source CS2 by biasing stage 30 with DC current control signal $I_{CS}$ being adjusted any variations in the voltage level of voltage control signal $V_{CS}$, and any temperature, processing performance supply power variations of transmitter chip 10. Ampere level $X_2$ of current control signal $I_{CS}$ as shown in FIG. 2 is well controlled by voltage control signal $V_{CS}$. Particularly, circuit 23 provides voltage adjustment signal $V_{AS1}$ and voltage adjustment signal $V_{AS2}$ as a result of any pre-distortion and temperature compensation of voltage control signal $V_{CS}$.

Figure 8:
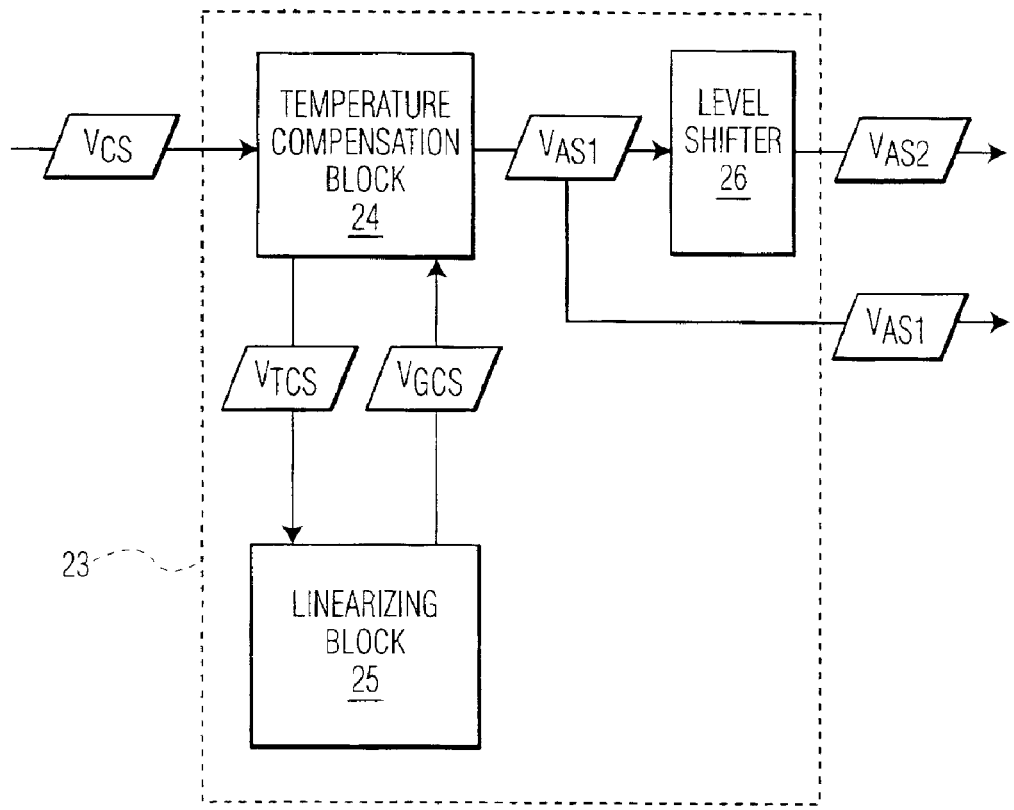
FIG. 8 is a block diagram of one embodiment in accordance of the present invention of the FIG. 6 variable gain amplifying stage.
Figure 9:
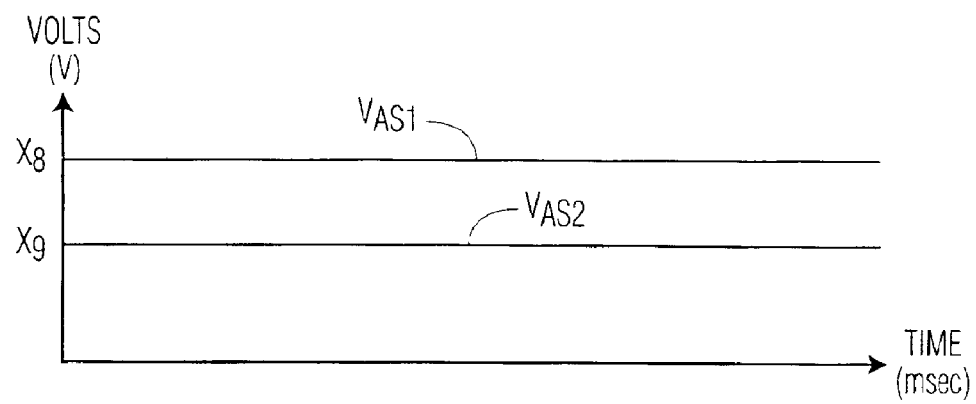
FIG. 9 illustrates two (2) voltage adjustment signals provided by the FIG. 8 adjustment circuit.

Referring to FIGS. 7A–8, an embodiment of circuit 23 including a conventional temperature compensation (TC) block 24, a conventional linearizing block 25 and a conventional level shifter block 26 is shown. TC block 24 receives voltage control signal $V_{CS}$, and in response thereto, provides a voltage temperature compensation signal $V_{TCS}$ to linearizing block 25 and a voltage adjustment signal $V_{AS1}$ to level shifter 26. In response to voltage temperature compensation signal $V_{TCS}$, linearizing block 25 provides a voltage gain control signal $V_{GCS}$ to TC block 24 that make the changes in the gain of circuit 21 and circuit 22 linear in terms of a logarithmic scale of voltage control signal $V_{CS}$. In response to voltage adjustment signal $V_{AS1}$, level shifter 26 provides voltage adjustment signal $V_{AS2}$ having a lower voltage level $X_9$ than the voltage level $X_8$ of voltage adjustment signal $V_{AS1}$ as shown in FIG. 9.

Referring again to FIG. 6, in an alternative embodiment of variable gain amplifying stage 20, an adjustment circuit 23 can be integrated into VGA 21 and another adjustment circuit 23 can be integrated into dummy VGA 22.

While the embodiments of the present invention disclosed herein are presently considered to be preferred, various changes and modifications can be made without departing from the spirit and scope of the present invention. The scope of the present invention is indicated in the appended claims, and all changes that come within the meaning and range of equivalents are intended to be embraced therein.

What is claimed is:

1. A variable gain amplifying stage in a transmitter chip, said variable gain amplifying stage comprising:
    a first circuit operable to provide a current drive signal in response to a reception of a voltage control signal and voltage intermediate frequency signal by said variable gain amplifying stage, said current drive signal having an AC current component and a DC current component;
    a second circuit operable to provide a DC current control signal in response to a reception of said voltage control signal by said variable gain amplifying stage; and
    wherein a ratio of a first ampere level of said DC current component of said current drive signal to a second ampere level of said DC current control signal is constant.

2. The variable gain amplifying stage of claim 1, wherein said second circuit is a replica of said first circuit.

3. The variable gain amplifying stage of claim 1, wherein means for adjusting said ampere level of said DC current component of said current drive signal and said ampere level of said DC current control signal in response to any variation in a voltage level of said voltage control signal.

4. The variable gain amplifying stage of claim 1, wherein means for adjusting said ampere level of said DC current component of said current drive signal and said ampere level of said DC current control signal in response to any variation in a temperature of the transmitter chip.

5. The variable gain amplifying stage of claim 1, wherein means for adjusting said ampere level of said DC current component of said current drive signal and said ampere level of said DC cuurrent control signal in response to any variation in a processing performance of the transmitter chip.

6. The variable gain amplifying stage of claim 1, wherein means for adjusting said ampere level of said DC current component of said current drive signal and said ampere level of said DC current control signal in response to any variation in a supply power of said transmitter chip.

7. A transmitter chip, comprising:
    a variable gain amplifying stage operable to provide a current drive signal and a DC current control signal, said DC current drive signal having an AC current component and a DC current component;
    a biasing stage operable to provide a first DC current biasing signal in response to a reception of said DC current control signal; and
    wherein a first ratio of a first ampere level of said DC current component of said current drive signal to a second ampere level of said DC current control signal is constant.

8. The transmitter chip of claim 7, wherein said variable gain amplifying stage includes means for adjusting said ampere level of said DC current component of said current drive signal and said ampere level of said DC current control signal in response to any variation in a voltage level of said voltage control signal.

9. The transmitter chip of claim 7, wherein said variable gain amplifying stage includes means for adjusting said ampere level of said DC current component of said current drive signal and said ampere level of said DC current control signal in response to any variation in a temperature of the transmitter chip.

10. The transmitter chip of claim 7, wherein said variable gain amplifying stage includes means for adjusting said ampere level of said DC current component of said current drive signal and said ampere level of said DC current control signal in response to any variation in a processing performance of the transmitter chip.

11. The transmitter chip of claim 7, wherein said variable gain amplifying stage includes means for adjusting said ampere level of said DC current component of said current drive signal and said ampere level of said DC current control signal in response to any variation in a supply power of said transmitter chip.

12. The transmitter chip of claim 7, wherein a second ratio of said second ampere level of said DC current control signal to a third ampere level of said first DC biasing current signal is constant.

13. The transmitter chip of claim 7, further comprising:
a phase shifting stage operable to provide a current intermediate frequency signal in response to a reception of said DC current drive signal and said first DC biasing current signal.

14. The transmitter chip of claim 13, further comprising:
a mixing stage;
wherein said biasing stage is further operable to provide a second DC biasing signal in response to a reception of said DC current control signal; and
wherein said mixing stage is operable to provide a current radio frequency signal in response to a reception of said current intermediate frequency signal and said second DC current biasing signal.

15. The transmitter chip of claim 14, wherein a second ratio of said second ampere level of said DC current control signal to a third ampere level of said second DC biasing current signal is constant.

16. The transmitter chip of claim 14, wherein a gain of said mixing stage is constant.

17. A method for dynamically biasing a transmitter chip, said method comprising:

generating a current drive signal in response to a reception of a voltage control signal and a voltage intermediate frequency signal, said current drive signal having an AC current component and a DC current component; and generating a DC current control signal in response to a reception of said voltage control signal, wherein a first ratio of a first ampere level of said DC component of said DC current drive signal to a second ampere level of said DC current control signal is constant.

18. The method of claim 17, further comprising:
generating a first DC current biasing signal in response to a generation of said DC current control signal,
where a second ratio of said second ampere level of said DC current control signal to a third ampere level of said DC current biasing signal is constant.

19. The method of claim 18, further comprising:
generating a current intermediate frequency signal in response to a generation of said fist DC current drive signal;
generating a second DC current biasing signal in response to a generation of said DC current control signal; and
generating a current radio frequency signal in response to a generation of said current intermediate frequency signal said and said second DC current biasing signal.

* * * * *